United States Patent [19]

RomanòLuigi

[11] Patent Number: 5,001,547
[45] Date of Patent: Mar. 19, 1991

[54] METHOD AND APPARATUS FOR IMPROVING THERMAL COUPLING BETWEEN A COOLING PLATE OF A SEMICONDUCTOR PACKAGE HOUSING AND A HEAT SINK

[75] Inventor: RomanòLuigi, Monza, Italy

[73] Assignee: SGS Microelettronica S.p.A., Agrate Brianza, Italy

[21] Appl. No.: 391,674

[22] Filed: Aug. 7, 1989

Related U.S. Application Data

[63] Continuation of Ser. No. 105,960, Oct. 8, 1987, abandoned, which is a continuation of Ser. No. 662,246, Oct. 18, 1984, abandoned.

[30] Foreign Application Priority Data

Oct. 21, 1983 [IT]  Italy ................................ 23385 A/83

[51] Int. Cl.⁵ ............................................. H01L 23/02
[52] U.S. Cl. ...................................... 357/074; 357/81; 357/72; 357/68; 439/571; 439/431; 439/432
[58] Field of Search .................. 357/65, 69, 70, 72, 357/81, 74, 65, 69, 70, 72, 81, 79; 439/571, 431, 432, 571, 431, 432

[56] References Cited

U.S. PATENT DOCUMENTS

| | | |
|---|---|---|
| 1,016,728 | 2/1912 | Barber .............................. 439/341 X |
| 3,522,490 | 8/1970 | Kauffman .......................... 357/72 X |
| 3,942,857 | 3/1976 | Hennemann ..................... 439/571 X |
| 4,249,034 | 2/1981 | Fichot et al. ...................... 357/81 X |
| 4,451,973 | 6/1984 | Tateno et al. ..................... 357/70 X |
| 4,510,677 | 4/1985 | Collumeau ......................... 357/69 X |

FOREIGN PATENT DOCUMENTS

| | | | |
|---|---|---|---|
| 0075277 | 4/1961 | France .............................. 439/571 X |
| 2441272 | 6/1980 | France .............................. 357/72 X |
| 0442844 | 1/1950 | Italy ................................. 439/571 X |
| 57-149754 | 9/1982 | Japan ............................... 357/72 X |
| 59-152653 | 8/1984 | Japan ............................... 357/72 X |
| 2132015 | 6/1984 | United Kingdom ............. 357/72 X |
| 2147457 | 5/1985 | United Kingdom ............. 357/72 X |

*Primary Examiner*—William Mintel
*Attorney, Agent, or Firm*—Harry M. Weiss; Antonio R. Durando

[57] ABSTRACT

A semiconductor component package comprises a metal plate and a synthetic resin housing or body. The plate is formed with an aperture by which it can be secured to a heat sink, generally a metal plate. Around the aperture is a weakened annular portion produced by shearing. When the package housing is secured to a surface which is not completely flat, mechanical stressing due to the tightening of the screw coupling is limited to the weakened annular portion and is not transmitted to the resin housing and to the elements therein.

2 Claims, 1 Drawing Sheet

METHOD AND APPARATUS FOR IMPROVING THERMAL COUPLING BETWEEN A COOLING PLATE OF A SEMICONDUCTOR PACKAGE HOUSING AND A HEAT SINK

This is a continuation of co-pending application Ser. No. 105,960 filed Oct. 8, 1987, now abandoned, which is a continuation of Ser. No. 662,246 filed Oct. 18, 1984 now abandoned, which is based on Italian patent application Ser. No. 23385 A/83 filed Oct. 21, 1983.

BACKGROUND OF THE INVENTION

1. Field of the Invention

This invention relates generally to semiconductor devices and more particularly to a package housing for power transistors or power integrated circuits.

2. Discussion of the Related Art

A typical package housing for power semiconductor devices is illustrated by the TO-220 package. This package housing comprises a metal plate partially embedded in a synthetic resin or plastic body exposing a major surface of the plate. One or more semiconductor chips forming the operative part of the device, are secured to the other major surface of the plate and are in good thermal contact therewith to ensure an external sink or dissipating element for the heat produced by the chip in operation. Rigid metal conductors serving as connecting terminals for the device are connected to metallized zones of the semiconductor chips by thin metal wires and are also partly embedded in the resin body. The unembedded part of the plate is formed with a through-hole enabling the plate to be secured to a heat dissipating element by a screw or rivet.

The known package housing of the kind described, although having many advantages over others of different types such as low production costs, do not ensure adequate mechanical strength in all applications. This disadvantage is principally the result of the fact that the metal and the resin (or plastic) used for the package housing have different physical characteristics from one another. The different physical characteristics prevent a completely rigid securing of the resin body to the metal plate. During some phases of the process for producing the package housing and, more particularly, when the device is secured to a heat dissipating element by the user, there is a risk of the semiconductor chip being subjected to mechanical stresses likely to damage it. This risk is very high when the package housing is screwed to a dissipating element which is not completely flat, or which is slightly concave.

Various solutions for the problem have been proposed. For instance, an attempt has been made to use an intermediate layer of a material which adheres well both to the resin and to the metal and which is highly resilient. The different expansions of the metal plate and of the resin body are thus compensated for and the mechanical stresses transmitted to the semiconductor chip are reduced. It has also been proposed to use claws or grooves or through-holes in the metal plate to improve the securing of the resin body to the metal plate. However, solutions of this kind do not always solve the problem. In addition, these solutions complicate the devices and manufacturing processes and therefore increase the cost of the resulting electronic component.

SUMMARY

It is an object of the present invention to provide a package housing which can be secured conveniently to heat sinks, even when the heat sinks do not have completely flat surfaces, and provides a housing which is inexpensive to fabricate.

These and other objects are accomplished, according to the present invention, by improving the thermal coupling between a cooling plate part of the electronic component package housing and an external heat sink, typically a metal plate. The improved thermal coupling is provided by weakening the region surrounding the aperture by which a coupling mechanism, typically a screw, secures the cooling plate to the heat sink. The region is weakened by having two processing surfaces secure the upper and lower surfaces of the cooling plate with apertures in the vicinity of the cooling plate aperture. A first piston element displaces a region determined by the surface apertures in the vicinity of the housing aperture and a second piston element repositions the displaced region in its original position relative to the plate.

BRIEF DESCRIPTION OF THE EMBODIMENTS

In accordance with one embodiment of the present invention, a package housing for a semiconductor device is disclosed. The package housing includes a metal plate and a synthetic resin envelope in which a part of the plate is embedded, a major surface of the plate being left exposed, a part of the plate which is not embedded in the envelope being formed with a least one aperture through which a securing element can extend, the plate having around the aperture a portion bounded by a cylindrical region whose metallic connections to a remainder of the plate are interrupted, the cylindrical region still being rigidly secured to the plate.

In accordance with another embodiment of the present invention, a method of processing a region around an electronic component cooling plate aperture wherein a coupling means passes through the aperture for coupling the coupling plate to a heat sink, is described. The processing method includes the step of mechanically weakening the cooling plate aperture region.

In accordance with still another embodiment of the present invention, an electronic component package is disclosed and includes circuit elements and a housing surrounding the circuit elements, the housing including a cooling plate with an aperture for receiving a coupling means with a region around the aperture being mechanically weakened.

In accordance with yet another embodiment of the present invention, an electronic component package is described. The package includes circuit elements and housing means for enclosing the circuit elements. The housing means include plastic means for enclosing a first portion of the circuit elements and cooling means for enclosing a second portion of the circuit elements, the cooling means having a structure means for limiting stress between the plastic means and cooling means.

In accordance with yet another embodiment of the present invention, the method of reducing stress between a cooling plate and a resin portion of an electronic component package comprises the step of mechanically weakening a region around an aperture subjected to stress when the aperture receives coupling apparatus. The coupling apparatus couples the cooling plate to an external heat sink.

In accordance with another embodiment of the present invention, a cooling plate for use in an electronic component for thermal coupling to an external heat sink is described. The cooling plate includes a surface means adapted to engage, a surface of the external heat sink aperture means and structure means surrounding the aperture means for providing a region of weakened structural strength.

These and other features of the present invention will be understood upon reading of the following description along with the drawings.

DESCRIPTION OF THE PREFERRED EMBODIMENT

Figure 1:
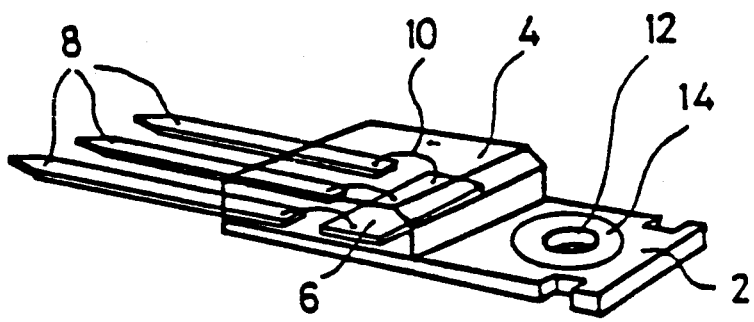
FIG. 1 is a perspective view to an enlarged scale of a type TO-220 package housing improved in accordance with the invention.

Referring to FIG. 1, a type TO-220 package housing comprises a metal cooling plate 2, for instance, of copper, and typically of a thickness of approximately 1.5 mm, part of the plate 2 being embedded in a synthetic resin body 4 approximately 5 mm thick. A semiconductor chip 6, for instance, of silicon, forming the operative part of the device is secured to the plate 2 in good thermal contact therewith. Connecting terminals 8 (three in FIG. 1) are partly embedded in the resin body 4 and are connected to the chip 6 by connecting wires 10. Through the agency of a through-hole 12 in the plate 2 the device ca be secured to a large metal heat dissipator. According to the invention, the plate 2 has around the aperture 12 an annular part 14 which, although integral with the remainder of the plate 2, is structurally distinct therefrom.

Figures 2A, 2B, 2C:
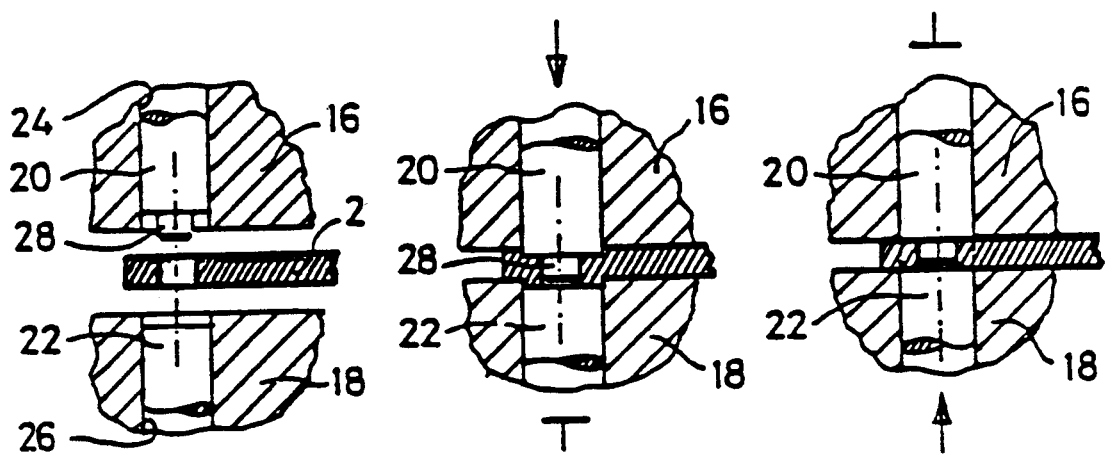
FIGS. 2a, 2b and 2c are diagrammatic cross-sectional views of part of a parting-off machine used in the preparation of a package housing cooling plate of the kind shown in FIG. 1 in different phases of the process according to the invention.

To modify the metal structure locally in order to produce the annular part 14, the plate 2 is given three consecutive stages of mechanical treatment, preferably before the stages of assembling the housing when it is still connected to other similar plates obtained by separation of elements in a lamination strip. In the first phase, as shown in FIG. 2a, the plate 2 is positioned between flat parallel surfaces of two clamping blocks 16, 18 of a parting-off machine having two pistons 20, 22 movable in respective coaxial cylinders 24, 26 in the two blocks 16, 18 and having a cross-section equal to the cross-section of that part of the plate 2 which it is required to separate. The bottom piston or punch 22 has a flat pressure surface parallel to the facing surfaces of the two blocks 16, 18. The top piston 20 terminates in a coaxial cylinder 28 of a cross-section slightly less than the cross-section of aperture 12 in plate 2 and of a height less than the thickness of the plate 2 and has an annular pressing surface parallel to the surfaces of the clamping blocks. The plate 2 is so positioned that the aperture 12 is centered on the axis of the pistons or punches 20, 22. In the second phase, as shown in FIG. 2b, the two blocks 16, 18 are closed on the plate 2. The bottom punch 22 is lowered relative to the surface of the block 18 by an amount less than the thickness of the plate 2, for instance, half such thickness. The top punch 20 has the cylinder 28 engaged in the aperture 12. In this phase the top punch 20 is lowered so that its pressing surface projects from the surface of the block 16 to the same extent as the lowering of the bottom punch 22. In this phase an annular portion bounded by the pressing surfaces of the punches 20 and 22 is sheared from the plate 2. In the next phase, as shown in FIG. 2c, the pistons 20, 22 move so that their pressing surfaces become coplanar with or slightly projecting from the facing surfaces of the blocks 16, 18. In this phase the material sheared in the previous phase (is returned to its original position and compressed there) in order to remain rigidly secured to the remainder of the plate 2.

Figure 3:
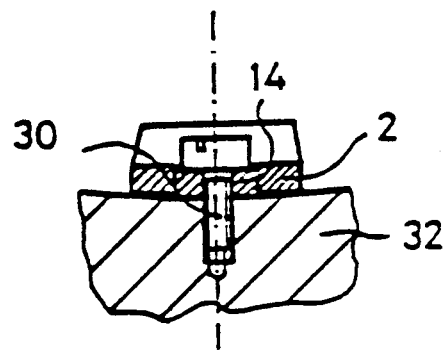
FIG. 3 is a cross-section of the package housing cooling plate secured to a heat dissipator according to the present invention.

Referring now to FIG. 3, a package housing cooling plate, according to the invention, is secured by a screw 30 to a heat dissipator 32 on a surface which, instead of being perfectly flat as would be desirable, is slightly concave. To clarify the illustrative example, the concavity is exaggerated in FIG. 3. As will be apparent therefrom, when the screw 30 is tightened the annular part 14 tends to move towards the inside of the cylindrical shear surface, so that the mechanical stresses transmitted to the remainder of the plate 2 are much less than they would be if the plate had not been treated as hereinbefore described. The only requirement to achieve this effect is to use a screw with a head smaller than the annular part 14. Also, because of the compression applied to the sheared material in the phase shown in FIG. 2c, the annular member 14 sticks to the shear surface sufficiently tightly to ensure attachment of the holder to the heat dissipator.

It will be clear to those skilled in the art that the metal plate of the package housing can be formed with more than one aperture for securing to a heat dissipating element and that the sheared portion of the plate could have a shape other than the generally cylindrical shape shown.

The above description is included to illustrate the operation of the preferred embodiment and is not meant to limit the scope of the invention. The scope of the invention is to be limited only by the following claims. From the above discussion, many variations will be apparent to one skilled in the art that would yet encompassed by the spirit and scope of the invention.

What is claimed is:

1. An electronic component package including a metal cooling plate for transferring heat to an external heat sink comprising, in combination:
   a substantially flat metal cooling plate portion;
   through-hole means in said substantially flat metal cooling plate portion for screw attachment of said package to said external heat sink;
   a screw passing through said through-hole means;
   a head on said screw; and
   said substantially flat metal cooling plate portion including an annular portion completely surrounding said though-hole means and larger than said screw head, said annular portion being separated from the remainder of said flat cooling plate portion by a structurally distinct sheared region for reducing the stress transmitted to the remainder of said flat cooling plate due to the tightening of said screw, wherein said structurally distinct region is created by shearing said annular portion surrounding said through-hole from said flat cooling plate by displacing said annular metal portion from the remainder of said flat cooling plate portion by a predetermined amount during the manufacture of said package and then restoring said metal portion by compressing it in place through elastic deformation to provide said structurally distinct region in aid flat cooling plate.

2. An electronic component package including a metal cooling plate for transferring heat to an external heat sink, comprising, in combination:

a substantially flat metal cooling plate portion;

through-hole means in said substantially flat metal cooling plate portion for permitting said package to be attached to said external heat sink screw means having a head with a diameter larger than the diameter of said through-hole means for attaching said package to said external heat sink;

said substantially flat metal cooling plate portion including sheared and recompressed in place annular portion means completely surrounding said through-hole means for reducing the stress transmitted tot he remainder of said flat cooling plate due to the tightening of said screw means, said annular portion means being provided in said cooling plate portion prior to the introduction of said screw means into said through-hole means.

* * * * *